United States Patent
Amato et al.

(10) Patent No.: US 10,916,324 B2
(45) Date of Patent: Feb. 9, 2021

(54) DATA STATE SYNCHRONIZATION INVOLVING MEMORY CELLS HAVING AN INVERTED DATA STATE WRITTEN THERETO

(71) Applicant: Micron Technology, Inc., Boise, ID (US)

(72) Inventors: Paolo Amato, Treviglio (IT); Marco Dallabora, Melegnano (IT); Daniele Balluchi, Cernusco sul Naviglio (IT); Danilo Caraccio, Milan (IT); Emanuele Confalonieri, Lesmo (IT)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 16/128,113

(22) Filed: Sep. 11, 2018

(65) Prior Publication Data

US 2020/0082900 A1    Mar. 12, 2020

(51) Int. Cl.
  *G11C 29/00*  (2006.01)
  *G11C 29/42*  (2006.01)
  (Continued)

(52) U.S. Cl.
  CPC .......... *G11C 29/42* (2013.01); *G06F 11/1068* (2013.01); *G11C 7/222* (2013.01);
  (Continued)

(58) Field of Classification Search
  CPC ..... G11C 29/42; G11C 29/44; G11C 13/0023; G11C 13/0097; G11C 13/0069;
  (Continued)

(56) References Cited

U.S. PATENT DOCUMENTS 5,134,616 A   7/1992   Barth, Jr. et al.
5,961,660 A   10/1999  Capps, Jr. et al.
(Continued)

FOREIGN PATENT DOCUMENTS

WO   2017-222775 A1   12/2017

OTHER PUBLICATIONS

International Search Report and Written Opinion from related International Application No. PCT/US2019/049451, dated Dec. 20, 2019, 11 pages.

(Continued)

*Primary Examiner* — Albert Decady
*Assistant Examiner* — Enamul M Kabir
(74) *Attorney, Agent, or Firm* — Brooks, Cameron & Huebsch, PLLC

(57) ABSTRACT

An example apparatus includes a memory comprising a plurality of managed units corresponding to respective groups of resistance variable memory cells and a controller coupled to the memory. The controller is configured to cause performance of a cleaning operation on a selected group of the memory cells and generation of error correction code (ECC) parity data. The controller may be further configured to cause performance of a write operation on the selected group of cells to write an inverted state of at least one data value to the selected group of cells and write an inverted state of at least one of the ECC parity data to the selected group of cells.

28 Claims, 8 Drawing Sheets

(51) Int. Cl.
*G11C 29/44* (2006.01)
*G11C 13/00* (2006.01)
*G11C 7/22* (2006.01)
*G06F 11/10* (2006.01)
*G11C 29/04* (2006.01)

(52) U.S. Cl.
CPC ...... *G11C 13/0023* (2013.01); *G11C 13/0069* (2013.01); *G11C 13/0097* (2013.01); *G11C 29/44* (2013.01); *G11C 2029/0411* (2013.01)

(58) Field of Classification Search
CPC ............ G11C 7/222; G11C 2029/0411; G11C 13/004; G11C 13/0004; G06F 11/1048; G06F 11/1068
See application file for complete search history.

(56) References Cited

U.S. PATENT DOCUMENTS

| | | | |
|---|---|---|---|
| 7,778,079 | B2 | 8/2010 | Jeong et al. |
| 8,356,153 | B2 | 1/2013 | Franceschini et al. |
| 8,467,237 | B2 | 6/2013 | Bedeschi et al. |
| 8,649,212 | B2 | 2/2014 | Kau et al. |
| 9,472,274 | B1 | 10/2016 | Lung |
| 9,612,958 | B1 | 4/2017 | Asnaashari |
| 9,654,148 | B2 | 5/2017 | Zhao et al. |
| 10,083,751 | B1* | 9/2018 | Dallabora .......... G11C 13/0038 |
| 2005/0055495 | A1 | 3/2005 | Vihmalo et al. |
| 2008/0140918 | A1 | 6/2008 | Sutardja |
| 2008/0266942 | A1 | 10/2008 | Jeong et al. |
| 2009/0055575 | A1 | 2/2009 | Hanhimaki et al. |
| 2010/0011357 | A1 | 1/2010 | Ramaurthy |
| 2010/0169708 | A1 | 7/2010 | Rudelic et al. |
| 2011/0167197 | A1 | 7/2011 | Leinwander |
| 2012/0195112 | A1* | 8/2012 | Alam .................. G11C 11/1673 365/158 |
| 2012/0198313 | A1* | 8/2012 | Alam ................ H03M 13/2906 714/773 |
| 2012/0331204 | A1 | 12/2012 | Karpov et al. |
| 2013/0010550 | A1* | 1/2013 | Kim ..................... G11C 13/004 365/189.15 |
| 2013/0139008 | A1 | 5/2013 | Kalyanasundharam et al. |
| 2013/0219105 | A1 | 8/2013 | Confalonieri |
| 2013/0343131 | A1 | 12/2013 | Wu et al. |
| 2014/0321192 | A1* | 10/2014 | Bedeschi ........... G11C 13/0069 365/148 |
| 2016/0232971 | A1* | 8/2016 | Yoon ................... G11C 11/5657 |
| 2016/0284399 | A1 | 9/2016 | Mantegazza et al. |
| 2017/0220266 | A1* | 8/2017 | Ahmad ................ G11C 7/1006 |
| 2017/0345491 | A1* | 11/2017 | Roy .................... G06F 11/1068 |
| 2017/0365318 | A1* | 12/2017 | Ingalls ................ G11C 11/2273 |
| 2018/0129423 | A1 | 5/2018 | Amato et al. |
| 2018/0129424 | A1 | 5/2018 | Confalonieri et al. |
| 2018/0129575 | A1* | 5/2018 | Dallabora ............... G06F 3/061 |
| 2018/0225173 | A1* | 8/2018 | Baek .................. G06F 11/1048 |
| 2019/0034266 | A1* | 1/2019 | Terada ................ G06F 11/3037 |
| 2020/0043541 | A1 | 2/2020 | Ingalls et al. |

OTHER PUBLICATIONS

Qureshi et al. "Enhancing Lifetime and Security of PCM-Based Main Memory with Start-Gap Wear Leveling" Proceedings of the 42nd Annual IEEE/ACM International Symposium on Microarchitecture, New York, NY, Dec. 2009, 10 pp.

Chul, et al. "A Hybrid Flash File System Based on NOR and NAND Flash Memories for Embedded Devices", In proceedings of the 8th Annual IEEE Transactions on Computers, vol. 57, Issue 7, Jul. 2008, pp. 1002-1008.

Kim, et al. "A PRAM and NAND Flash Hybrid Architecture for High-Performance Embedded Storage Subsystems", In Proceedings of the 8th ACM International Conference on Embedded Software (EMSOFT 2008), ACM, New York, NY, Oct. 2008, pp. 31-39.

Awasthi, et al. "Handling PCM Resistance Drift with Device, Circuit, Architecture, and System Solutions", Non-Valatile Memory Worship, San Diego, Mar. 2011, 2 pp.

Amato et al., "Fast Decoding ECC for Future Memories", IEEE Journal on Selected Areas in Communication, vol. 34, No. 9, Sep. 2016, 12 pages.

Liao et al., "Adaptive Wear-Leveling in Flash-Based Memory", IEEE Computer Architecture Letters, vol. 14, No. 1, Jan. 2015, pp. 1-4.

U.S. Appl. No. 15/958,496, entitled, "Error Correction Using Hierarchical Decoders" filed Apr. 20, 2018, 22 pp.

U.S. Appl. No. 15/994,477, entitled, "Data Relocation in Memory Having Two Portions of Data" filed May 31, 2018, 22 pp.

* cited by examiner

DATA STATE SYNCHRONIZATION INVOLVING MEMORY CELLS HAVING AN INVERTED DATA STATE WRITTEN THERETO

TECHNICAL FIELD

The present disclosure relates generally to semiconductor memory and methods, and more particularly, to data state synchronization associated with memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

Resistance variable memory such as PCRAM includes resistance variable memory cells that can store data based on the resistance of a storage element (e.g., a storage element having a variable resistance). As such, resistance variable memory cells can be programmed to store data corresponding to a target state by varying the resistance level of the resistance variable storage element. Resistance variable memory cells can be programmed to a target state corresponding to a particular resistance, by applying sources of an electrical field or energy, such as positive or negative electrical signals (e.g., positive or negative voltage or current signals) to the cells.

One of a number of states (e.g., resistance states) can be set for a resistance variable memory cell. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to respective digit patterns (e.g., 10, 01, 00, 11, 111, 101, 100, 1010, 1111, 0101, 0001, etc.). Such cells may be referred to as multi state cells, multi-digit cells, and/or multilevel cells (MLCs).

The state of the resistance variable memory cell can be determined (e.g., read), for example, by sensing current through the cell responsive to an applied interrogation voltage. The sensed current, which varies based on the resistance of the cell, can indicate the state of the cell (e.g., the binary data stored by the cell). However, the resistance of a programmed resistance variable memory cell can drift (e.g., shift) over time. Resistance drift can result in erroneous sensing of a resistance variable memory cell (e.g., a determination that the cell is in a state other than that to which it was programmed), among other issues.

DETAILED DESCRIPTION

Figure 1:
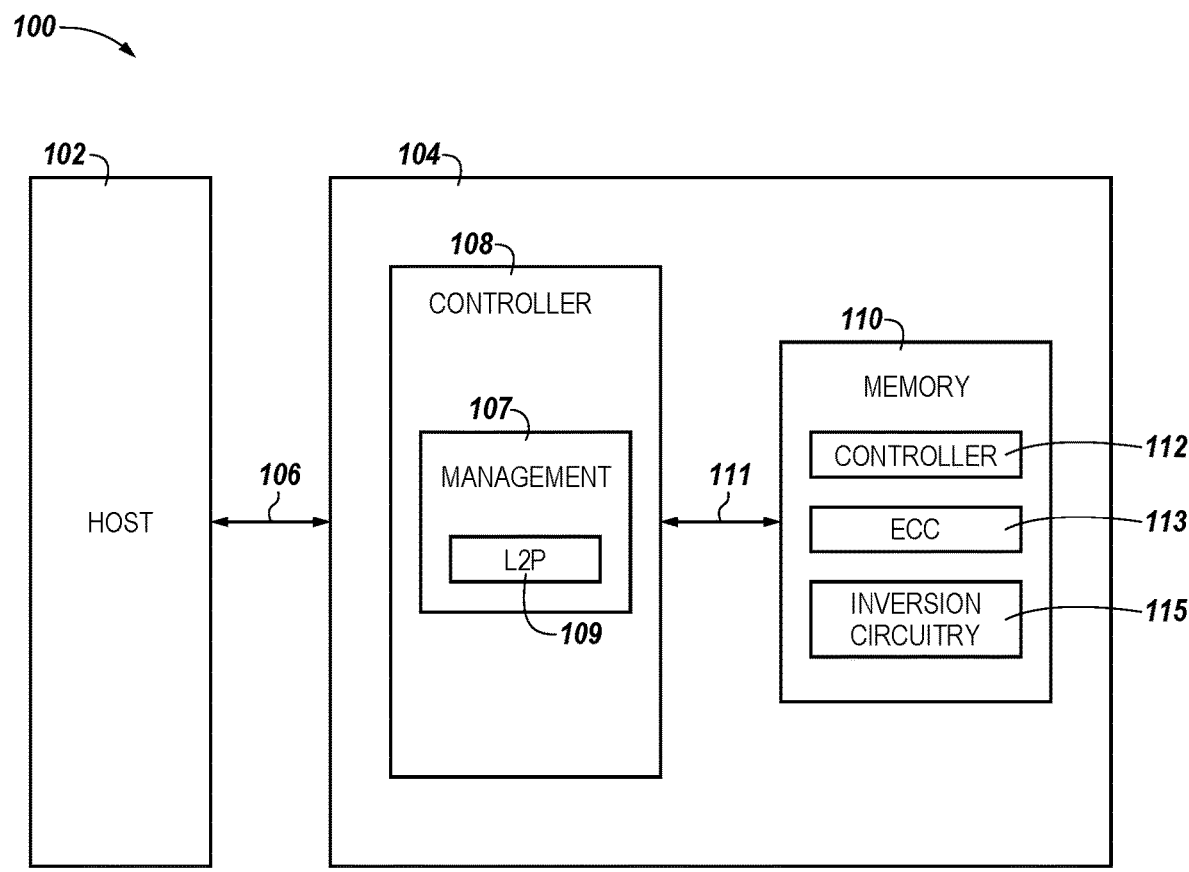
FIG. 1 is a block diagram of an apparatus in the form of a computing system including a memory system capable of providing data state synchronization in accordance with a number of embodiments of the present disclosure.

The present disclosure includes apparatuses, and methods for data state synchronization. An example apparatus includes a memory comprising a plurality of managed units corresponding to respective groups of resistance variable memory cells and a controller coupled to the memory. The controller is configured to cause performance of a cleaning operation on a selected group of the memory cells and generation of error correction code (ECC) parity data. The controller may be further configured to cause performance of a write operation on the selected group of cells to write an inverted state of at least one data value to the selected group of cells and write an inverted state of at least one of the ECC parity data to the selected group of cells.

Embodiments of the present disclosure can provide benefits such as reducing erroneous reading of resistance variable memory cells, whose resistance level can drift over time (e.g., after being programmed to a target state). Accordingly, embodiments can improve data reliability and/or data integrity as compared to previous approaches. For example, various previous approaches associated with correcting for resistance drift include tracking resistance drift (e.g., in the background in real time) and "refreshing" cells (e.g., setting the cells back to their target state) based on the amount of time the cells have been in a particular state and/or adjusting sensing threshold voltage levels to accommodate for the drift. Such an approach can require constantly maintaining information regarding drift time and/or can require a constant power supply, which may not be available for various applications such as mobile applications, for example.

Another prior approach can involve always writing all cells of a particular group (e.g., a page of cells) such that all the cells are "set" or "reset" at the same time. Such an approach can be costly in terms of energy consumption by requiring programming of cells that may not require programming pulses, for instance. In contrast, a number of embodiments of the present disclosure can provide data state synchronization in a manner that reduces erroneous reads due to cell resistance drift, while reducing energy consumption as compared to prior approaches. Additionally, various embodiments can provide data state synchronization without tracking drift time, which can provide benefits such as not requiring a constant power supply (e.g., battery power), among other benefits.

In some other prior approaches, data state synchronization may be provided by circuitry located external to the memory device, for example, by circuitry located on a host device and/or by control circuitry located external to the memory device. In such approaches, a status of a physical block address may be updated to a free status prior to writing data to the physical block address. In addition, in such approaches, commands and/or data may be transferred off of the memory device to perform data state synchronization.

In contrast, embodiments herein may allow for data state synchronization to be performed using circuitry located on or within the memory device, which may allow for reduced time and/or processing power in comparison to approaches in which data state synchronization is coordinated or performed by circuitry external to the memory device. Further, embodiments herein may allow for a status of a physical block address to be switched between an invalid status and a valid status without updating the status of the physical block address to a free status, which may simplify data state synchronization. In addition, embodiments herein may allow for data state synchronization to be performed on small managed units (SMUs) as well as large managed units (LMUs). As used herein, LMUs are managed units on the order of 4 kilobytes, while SMUs are managed units on the order of 64 bytes.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory cells) can refer to one or more memory cells, whereas a "plurality of" is intended to refer to more than one of such things. Furthermore, the words "can" and "may" are used throughout this application in a permissive sense (e.g., having the potential to, being able to), not in a mandatory sense (e.g., required to).

The figures herein follow a numbering convention in which the first digit or digits correspond to the drawing figure number and the remaining digits identify an element or component in the drawing. Similar elements or components between different figures may be identified by the use of similar digits. For example, 557 may reference element "57" in FIG. 5, and a similar element may be referenced as 657 in FIG. 6.

FIG. 1 is a block diagram of an apparatus in the form of a computing system 100 including a memory system 104 capable of providing data state synchronization in accordance with a number of embodiments of the present disclosure. As used herein, a memory system 104, a controller 108, or a memory device 110 might also be separately considered an "apparatus." The memory system 104 can be a solid state drive (SSD), for example, and can include a host interface 106, a controller 108 (e.g., a sequencer and/or other control circuitry), and a number of memory devices 110, which can serve as a memory for system 104 and can be referred to as memory 110.

The controller 108 can be coupled to the host 102 via host interface 106 and to the memory 110 via memory interface 111, and can be used to transfer data between the memory system 104 and a host 102. The host interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, the memory system 104 and the host 102 that are coupled to each other via the host interface 102 may each have a compatible receptor for passing control, address, data, and other signals via the host interface 106. Similarly, the controller 108 and the memory 110 may each have a receptor compatible with the memory interface 111. The interface 111 may support various standards and/or comply with various interface types (e.g., DDR, ONFI, NVMe, etc.).

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

As described above, the controller 108 can be coupled to the memory interface 111 coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

The controller 108 can include a management component 107. The management component 107 can provide and manage information (e.g., data) that can be used to locate data stored in the memory 110 and identify the frequency at which addresses (e.g., logical addresses) corresponding to data stored in the memory 110 has been accessed (e.g., during program operations). This information can be stored in a table 109 (e.g., logical to physical (L2P) address table). For example, the table 109 can include logical to physical address mappings and can indicate the frequency at which the physical addresses have been accessed during program operations. In a number of embodiments, the controller 108 is configured to select a group of memory cells (e.g., a page) independently of a particular logical address associated with a command (e.g., write command), and locate data associated with the write command in the memory 110 by updating and maintaining the logical to physical address table 107.

The memory 110 can include a number of memory arrays (not shown), a memory controller 112, error correction code (ECC) circuitry 113, and/or inversion circuitry 115. The ECC circuitry 113 and/or the inversion circuitry 115 can be located internal to the memory 110 and can perform error correction and/or inversion operation, respectively, on data received by the memory 110, as described in more detail in connection with FIGS. 3A-3B, 4A-4B, and 5-7, herein.

The ECC circuitry 113 can be configured to generate and/or decode parity bits as part of an error correction operation on data stored by the memory 110. In some embodiments, the ECC circuitry 113 may include logic and/or hardware configured to provide error correction functionality to the memory 110. Similarly, the inversion circuitry 115 may include logic and/or hardware configured to provide data inversion logic functionality to the memory 110. For example, the inversion circuitry 115 may be configured to perform inversion operations as described in more detail herein.

By including the ECC circuitry 113 and/or the inversion logic 115 on or within the memory 110, some embodiments may allow for parallelization of error correction, data inversion, and/or data state synchronization, as described in more detail in connection with FIGS. 5-7, herein. This may allow for write operations performed using the memory 100 to be optimized and/or improved in comparison to approaches in which data state synchronization, error correction, and/or data inversion are performed using circuitry external to the memory 110. In addition, by including the ECC circuitry 113 and/or the inversion logic 115 on or within the memory 110, some embodiments may further allow for on-die read retry functionality, which may improve error signaling to the memory system 104 and/or host 102, as described in more detail in connection with FIGS. 6-7, herein.

The memory controller 112, ECC circuitry 113, and/or inversion circuitry 115 may be configured to provide data state synchronization to the memory 110. Accordingly, in some embodiments, the memory 110 may be configured to perform data state synchronization operations without encumbering the host 102. Stated alternatively, in some embodiments, the memory 110 may be configured to perform on-die data state synchronization.

The memory controller 112 can be located internal to the memory 110, and can receive commands (e.g., write commands, read commands, refresh commands, etc.) from the controller 108 via the memory interface 111. As described further below, in a number of embodiments, the memory controller 112 can be configured to manage cell resistance drift by providing data state synchronization for memory 110 independently from the controller 108 and/or host 102 (e.g., without assistance from external controller 108 or host 102).

The memory array(s) of memory 110 can comprise, for example, non-volatile resistance variable memory cells each having an associated select element and a storage element. The select elements in each resistance variable memory cells can be operated (e.g., turned on/off) to select the memory cells in order to perform operations such as data programming and/or data reading operations on the resistance variable memory cells.

In some embodiments, the memory cells may be organized into pages of memory cells, such as user pages. In a non-limiting example, the memory cells may be organized into pages that include 512 bits (e.g., 64 bytes), 30 parity bits for performance of a triple-error correcting code, an inversion bit (e.g., a one-bit inversion flag), and/or one or more additional bits. In this example, a user page size may include 588 bits (e.g., 68 bytes).

As used herein, a storage element refers to a programmable portion of a resistance variable memory cell. For example, in PCRAM and RRAM cells, a storage element can include the portion of the memory cell having a resistance that is programmable to data states responsive to applied programming signals (e.g., voltage and/or current pulses), for example. The storage element can include a resistance variable material such as a phase change material (e.g., phase change chalcogenide alloy) such as an indium (In)-antimony(Sb)-tellurium(Te) (IST) material, e.g., $In_2Sb_2Te_5$, $In_1Sb_2Te_4$, $In_1Sb_4Te_7$, etc., or a germanium-antimony-tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

The select element can also be a chalcogenide material such as those described above. While the select element and the storage element can comprise different chalcogenide materials, embodiments are not so limited. For example, each cell can comprise a material (e.g., a chalcogenide material) that can serve as both the storage element and the select element (e.g., a switch and storage material (SSM)).

Resistance variable memory cells are rewritable as compared to floating gate cells of NAND memory array. For example, a particular data pattern can be programmed to a group of resistance variable memory cells without necessarily erasing data previously stored in the group.

Resistance memory cells can experience resistance drift (e.g., toward higher resistance) during a time between application of, for example, two operation signals (e.g., programming and/or reset signals). That is, the resistance level of the resistance memory cells can shift over time. Such resistance drift can be due to a spontaneous increase of the resistance of the resistance level of the cell after programming, for example, due to structural relaxation of an amorphous portion of the storage element (e.g., phase change material).

In operation, data can be written to and/or read from memory 110 as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host. In a number of embodiments, the memory 110 can store managed units in respective groups (e.g., physical pages) of memory cells (e.g., resistance variable memory cells). Although embodiments are not so limited, a managed unit may correspond to a logical page size (e.g., e.g., a data transfer size of a host such as host 102) and/or a data management size of a memory system (e.g., system 104), which can be, for example 4 KB, 8K, etc. Embodiments are not so limited, however, and the page size may correspond to a user page size of around 544 bits, as described above. As an example, a managed unit can be mapped (e.g., via controller 108) to a physical page of memory cells. However, a number of managed units (e.g., large managed units (LMUs) and/or small managed units (SMUs)) might be mapped to a physical page.

Figure 2A:
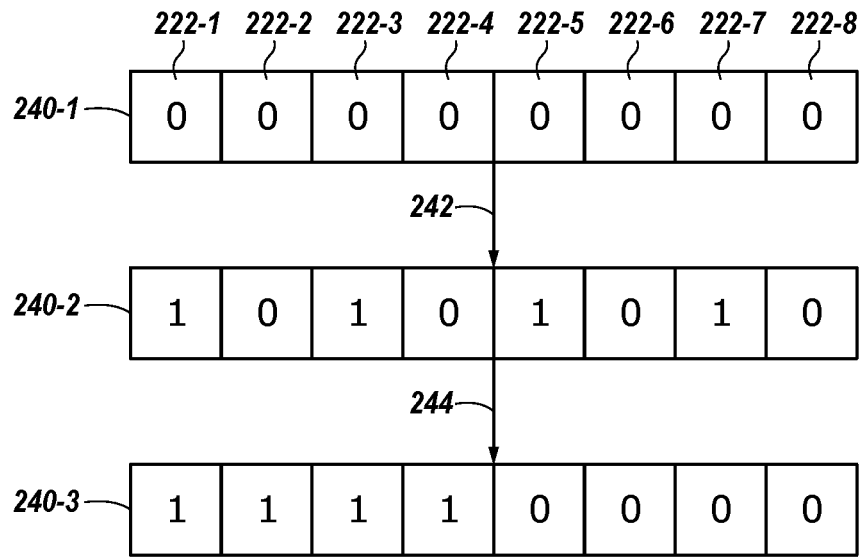
FIG. 2A-2B illustrates a group of resistance variable memory cells experiencing resistance drift.
Figure 2B:
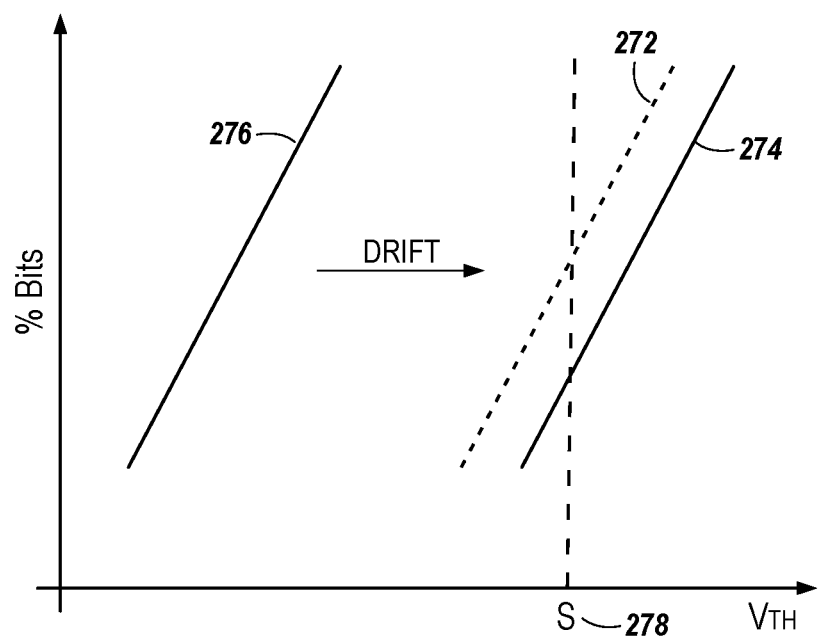

FIG. 2A-2B illustrates a group of resistance variable memory cells 222-1, 222-2, 222-3, 222-4, 224-5, 222-6, 222-7, and 222-8 (referred to collectively as cells 222) experiencing resistance drift. Although embodiments are not so limited, resistance distribution 274 corresponds to a reset state (e.g., a binary data value of "0"), and a resistance distribution 276 corresponds to a set state (e.g., binary data value of "1"). As shown in FIG. 2B, a reset state (e.g., distribution 274) corresponds to a higher resistance level than the set state (e.g., distribution 276). Resistance distribution 272 corresponds to cells programmed to distribution 276 but whose threshold voltage has drifted upward over time subsequent to being programmed.

In FIG. 2A, 240-1 represents a data pattern stored in the group of memory cells 222 (e.g., each of cells 222 are programmed to the reset state such that each cell is storing a binary value of "0"). Arrow 242 represents a write operation performed on the group and which results in a different data pattern 240-2 being stored in the group of cells 222. In this example, the write operation 242 involves programming cells 222-1, 222-3, 222-5, and 222-7 to the set state.

Arrow 244 represents a subsequent write operation performed on the group of memory cells 222 such that a different data pattern 240-3 is stored in the group of cells. As shown in FIG. 2A, the subsequent write operation 244 involves programming memory cells 222-5 and 222-7 from the set state (e.g., "1") back to the reset state (e.g., "0"). Write operation 244 also includes programming cells 222-2 and 222-4 from the reset state to the set state, while cells 222-1 and 222-3 remain in the set state and cells 222-6 and 222-8 remain in the reset state during the write operation 244.

Turning to FIG. 2B, during a time between the write operation 242 and the subsequent write operation 244 (e.g., referred to as a drift time), the group of memory cells 222 experience a resistance drift. Over the drift time, for example, resistance levels of those memory cells) programmed to the set state (e.g., distribution 276) during the write operation 242 (e.g., memory cells 222-1, 222-3, 222-5, and 222-7) are drifted to resistance distribution 272 (e.g., nearer to resistance distribution 274), while resistance levels of those memory cells programmed to the reset state (e.g., distribution 274) during the subsequent write operation 244 (e.g., cells 222-5 and 222-7) are returned to reset distribution 274. As result, the data pattern 240-3 (e.g., subsequent to write operation 244) includes cells belonging to resistance distribution 272 (e.g., cells 222-1 and 222-3) coexisting with cells belonging to resistance distribution 274 (e.g., cells 222-5 and 222-7). As such, a sensing voltage 278 used to read the group 222 (e.g., to distinguish between cells storing "0" and "1") may not be capable of accurately determining the states of cells belonging to the overlapping distributions 272 and 274, which may result in read errors.

Previous approaches to account for drift might involve always programming all of a page of cells (e.g., applying programming pulses to both those cells whose state is to be changed and those cells whose state is to remain the same), and/or tracking the drift time associated with the cells and adjusting the sensing threshold voltage (e.g., 278) as needed. However, such approaches may require a constant power source and/or can provide increased power consumption as compared to various embodiments of the present disclosure.

Other previous approaches are associated with keeping the gap between resistance levels of memory cells storing different data units. For example, those memory cells having a drifted resistance level above and/or below a certain threshold may be adjusted based on a tracked drift time. However, this previous approach may not be applicable when absolute time information is not available such that a drift time is no longer being tracked. This can be particularly problematic when power supply (e.g., required to track the drift time) is often not available to, for example, a memory system (e.g., a smartphone or any other mobile system).

Embodiments of the present disclosure can provide benefits such as energy-efficiently reducing erroneous data read on resistance variable memory cells (e.g., caused by a resistance drift of the resistance variable memory cells) without tracking a drift time associated with programmed states of resistance variable memory cells. For example, embodiments can provide data state synchronization that eliminates of a risk having a drifted set state (e.g., a resistance distribution 272 drifted near to, or overlapping with, a resistance distribution 274) that is indistinguishable from a newly-programmed reset state (e.g., a resistance distribution 274) in the absence of information associated with the drift time.

Figure 3A:
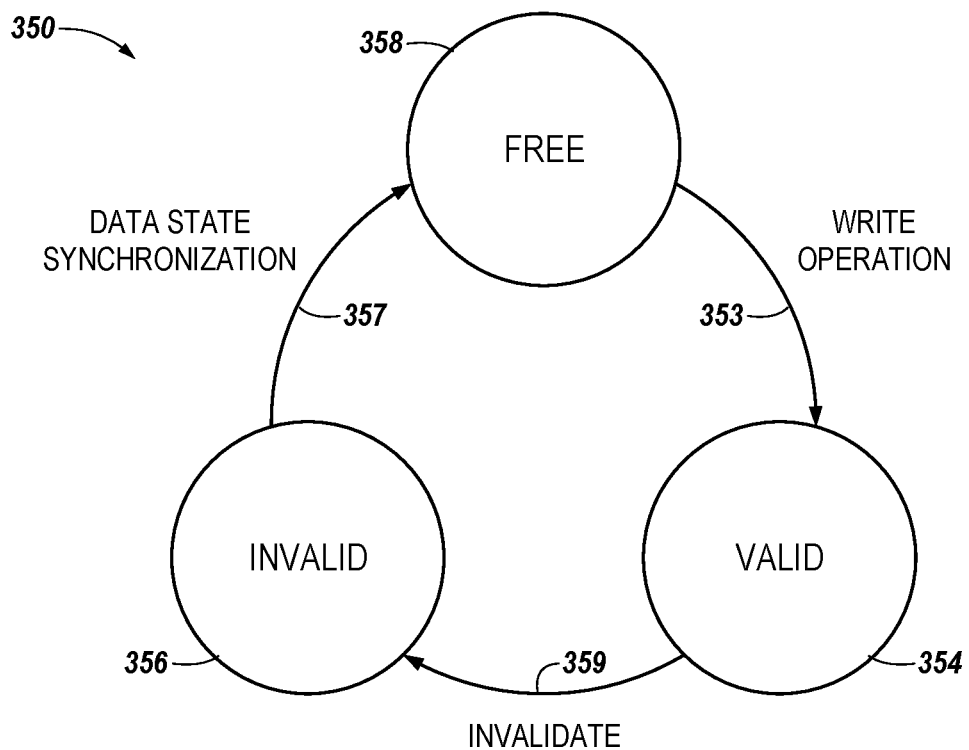
FIG. 3A illustrates a flow diagram associated with providing data state synchronization for a write operation in accordance with a number of embodiments of the present disclosure.

FIG. 3A illustrates a flow diagram 350 associated with providing data state synchronization in accordance with a number of embodiments of the present disclosure. As described in connection with FIG. 1, managed units can correspond to a particular data size and can be mapped to particular groups of memory cells (e.g., pages of resistance variable memory cells).

The flow diagram 350 illustrates an example of status transitions of managed units according to some approaches. The example shown in FIG. 3A illustrates a "free" status 358, a "valid" status 354, and an "invalid" status 356 of managed units. The status of managed units can be tracked, for example, by a controller such as controller 108 shown in FIG. 1. In a number of embodiments, the status transitions illustrated in flow diagram 350 may be experienced by managed units associated with a memory device (e.g., memory 110) comprising a resistance variable memory cells in association with providing data state synchronization in accordance with a number of embodiments of the present disclosure. The resistance variable memory cells can be programmable, for example, to one of two resistance states (e.g., a set state which may correspond to a logical "1" and a reset state which may correspond to a logical "0"). Although embodiments are not so limited, the reset state can correspond to a higher resistance level than the set state.

A free status 358 can refer to a managed unit that has experienced a "cleaning" operation and is ready to have a new data pattern programmed thereto. A cleaning operation can involve resetting of all of the memory cells of a corresponding managed unit (e.g., placing all of the cells in a "0" state). A valid status 354 can refer to a managed unit storing valid data (e.g., data currently in use by a system and having an up to date L2P mapping entry). An invalid status 356 can refer to a managed unit storing invalid data (e.g., data corresponding to a stale L2P mapping entry).

In FIG. 3A, arrow 353 represents a status transition of a managed unit from a free status 358 to a valid status 354 responsive to a write operation to store a particular data pattern in a group of cells corresponding to a selected managed unit. Responsive to the write operation, the status of the selected managed unit, which is mapped by controller 108, is updated (e.g., from free to valid) to reflect that the selected managed unit now stores valid data. As an example, in response to a received write command (e.g., a write command received from host 102 to controller 108), a particular managed unit from among a number of managed units having free status can be selected to have host data (e.g., a data pattern received from a host) programmed thereto.

Arrow 359 represents a status transition of a managed unit from a valid status 354 to an invalid status 356 responsive to being invalidated (e.g., such that its corresponding mapping entry is no longer up to date). For example, the status of the managed unit can be updated from valid to invalid responsive to a trimming command received from the host, which can result in logical erasure (e.g., such that the data is not physically erased from the corresponding page of cells).

Arrow 357 represents a transition of a selected managed unit from an invalid status 356 to a free status 358 responsive to experiencing a cleaning operation in which the cells corresponding to the managed unit are all placed in a same state (e.g., reset state). The cleaning operation can provide data state synchronization for a subsequent write operation performed on the group of cells corresponding to the managed unit. For instance, by placing all of the variable resistance memory cells of the group in a same state (e.g., reset state) prior to executing a subsequent write command to store another (e.g., different) data pattern in the group, the method of FIG. 3A can reduce read errors by eliminating the occurrence of cell threshold voltage distribution overlap such as that described in FIGS. 2A and 2B. Updating of the status of a managed unit to the free status responsive to the cleaning operation can return the managed unit to a pool of managed units available for a next write operation. In a number of embodiments, the cleaning operation can be provided as a background operation to reduce latency associated with performing, for example, host commands on the group memory cells.

In a number of embodiments, a cleaning operation can include application of a reset signal only to those cells of the group not already in the reset state. As such, those cells that are not already in the reset state are programmed to the reset state at the same time (e.g., simultaneously). This synchronization prevents a drifted set state (e.g., a resistance distribution 272 corresponding to a set state that is drifted) from coexistence with a newly programmed reset state (e.g., a resistance distribution 274 corresponding to a reset state that is adjusted), which can cause an erroneous data read (e.g., by reducing a gap between those two states) as illustrated in connection with FIG. 2B.

Further, since memory cells that are already programmed to a reset state (e.g., prior to cleaning) need not be reprogrammed to the reset state, the cleaning operation can be performed in an energy efficient manner by preventing reset pulses from being applied to cells already in the reset state. Even though, memory cells having drifted reset states coexist with memory cells having newly programmed reset state, those distributions may not result in erroneous data reads since the controller (e.g., controller 108 and/or 112) knows that the memory cells are always placed in a reset state prior to being programmed to a different data pattern. As such, a drift adjustment need not be performed, and therefore, a drift time need not be tracked.

In some approaches, providing data state synchronization in association with the flow diagram 350 can include determining whether the host data pattern includes a threshold quantity of data units (e.g., more than half) having a particular data value (e.g., a data value "0"), and, responsive to determining that the host data pattern includes at least the threshold quantity of data units having the particular data value, performing pattern inversion prior to storing the data pattern in the group of resistance variable memory cells. For example, performing the pattern inversion can include flipping the data units (e.g., bits) of the host data pattern such that all data units corresponding to a data value of "0" are flipped to a data value "1" and all data units) corresponding to a data value of "1" are flipped to a data value "0." Pattern inversion will be further described in connection with FIGS. 5 and 6.

Performing the pattern inversion can provide benefits such as reducing a quantity of cells of the group programmed to the lower resistance state (e.g., corresponding to a set state) as compared to a quantity of cells of the group that would be programmed to the lower resistance state (e.g., corresponding to a set state) in the absence of the pattern inversion. Performing the pattern inversion will be further described in connection with FIGS. 4A and 4B.

Figure 3B:
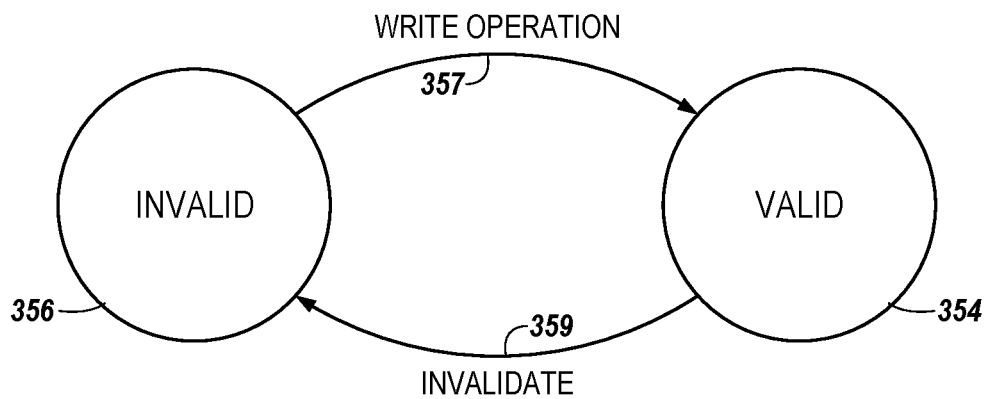
FIG. 3B illustrates another flow diagram associated with providing data state synchronization for a write operation in accordance with a number of embodiments of the present disclosure.

FIG. 3B illustrates another flow diagram associated with providing data state synchronization for a write operation in accordance with a number of embodiments of the present disclosure. In FIG. 3B, arrow 359 represents a status transition of a managed unit from a valid status 354 to an invalid status 356 responsive to being invalidated (e.g., such that its corresponding mapping entry is no longer up to date). For example, the status of the managed unit can be updated from valid to invalid responsive to a trimming command received from the host, which can result in logical erasure (e.g., such that the data is not physically erased from the corresponding page of cells).

Arrow 357 represents a transition of a selected managed unit from an invalid status 356 to a valid status 354 responsive to experiencing a write operation. In contrast to the example illustrated in FIG. 3A, as shown in FIG. 3B, managed units may be transferred from the valid status 354 to the invalid status 356 (and vice versa) without requiring the managed unit to be placed in a free status state. In some embodiments, this may allow for fewer operations to be performed by the memory device in comparison to some approaches, which may result in reduced time in performing memory operations and/or reduced power consumption by the memory device.

In some embodiments, as discussed above in connection with FIG. 3A, a cleaning operation in which the cells corresponding to the managed unit are all placed in a same state (e.g., reset state) may be performed. The cleaning operation can provide data state synchronization for a subsequent write operation performed on the group of cells corresponding to the managed unit. For instance, by placing all of the variable resistance memory cells of the group in a same state (e.g., reset state) prior to executing a subsequent write command to store another (e.g., different) data pattern in the group, the method of FIG. 3A can reduce read errors by eliminating the occurrence of cell threshold voltage distribution overlap such as that described in FIGS. 2A and 2B. Updating of the status of a managed unit to the free status responsive to the cleaning operation can return the managed unit to a pool of managed units available for a next write operation. In a number of embodiments, the cleaning operation can be provided as a background operation to reduce latency associated with performing, for example, host commands on the group memory cells.

In a number of embodiments, a cleaning operation can include application of a reset signal only to those cells of the group not already in the reset state. As such, those cells that are not already in the reset state are programmed to the reset state at the same time (e.g., simultaneously). This synchronization prevents a drifted set state (e.g., a resistance distribution 272 corresponding to a set state that is drifted) from coexistence with a newly programmed reset state (e.g., a resistance distribution 274 corresponding to a reset state that is adjusted), which can cause an erroneous data read (e.g., by reducing a gap between those two states) as illustrated in connection with FIG. 2B.

Further, since memory cells that are already programmed to a reset state (e.g., prior to cleaning) need not be reprogrammed to the reset state, the cleaning operation can be performed in an energy efficient manner by preventing reset pulses from being applied to cells already in the reset state. Even though, memory cells having drifted reset states coexist with memory cells having newly programmed reset state, those distributions may not result in erroneous data reads since the controller (e.g., controller 108 and/or 112) knows that the memory cells are always placed in a reset state prior to being programmed to a different data pattern. As such, a drift adjustment need not be performed, and therefore, a drift time need not be tracked.

In some approaches, providing data state synchronization in association with the flow diagram 350 can include determining whether the host data pattern includes a threshold quantity of data units (e.g., more than half) having a particular data value (e.g., a data value "0"), and, responsive to determining that the host data pattern includes at least the threshold quantity of data units having the particular data value, performing pattern inversion prior to storing the data pattern in the group of resistance variable memory cells. For example, performing the pattern inversion can include flipping the data units (e.g., bits) of the host data pattern such that all data units corresponding to a data value of "0" are flipped to a data value "1" and all data units) corresponding to a data value of "1" are flipped to a data value "0." Pattern inversion will be further described in connection with FIGS. 5 and 6.

Performing the pattern inversion can provide benefits such as reducing a quantity of cells of the group programmed to the lower resistance state (e.g., corresponding to a set state) as compared to a quantity of cells of the group that would be programmed to the lower resistance state (e.g., corresponding to a set state) in the absence of the pattern inversion. Performing the pattern inversion will be further described in connection with FIGS. 4A and 4B.

Figure 4A:
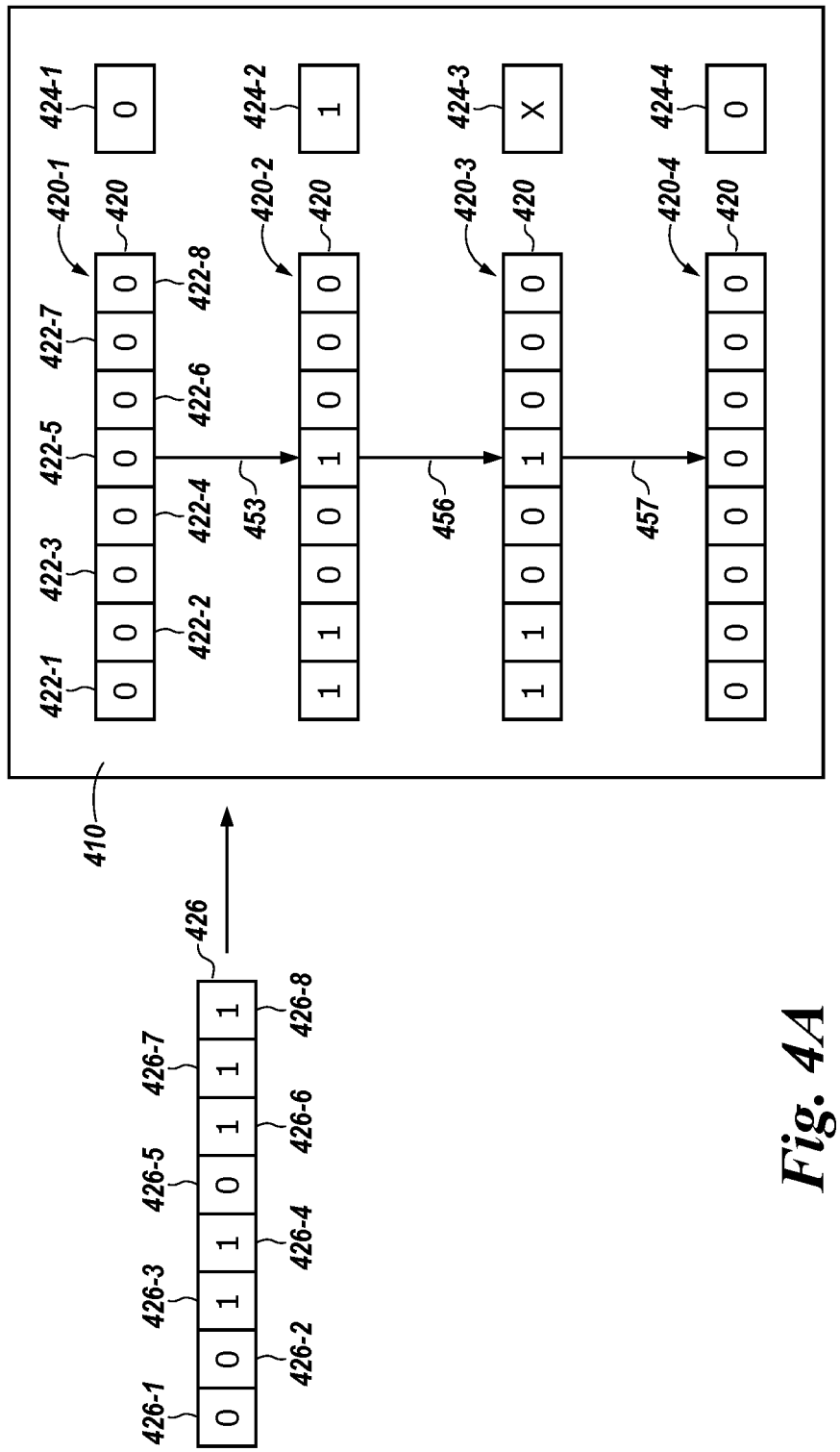
FIG. 4A illustrates a status of a managed unit associated with providing data state synchronization in accordance with a number of embodiments of the present disclosure.

FIG. 4A illustrates a status of a managed unit 420 associated with providing data state synchronization in accordance with a number of embodiments of the present disclosure. As described above, the managed unit 420 may be a large managed unit (LMU) or a small managed unit (SMU). In some embodiments, a LMU may be a managed unit on the order of the 4K bytes, while a SMU may be on the order of 64 bytes.

In the example of FIG. 4A, the memory 410 comprises a plurality of managed units corresponding to respective groups of resistance variable memory cells that are programmable to a reset state and a set state, although only one managed unit (e.g., managed unit 420) is shown in FIG. 4A. As illustrated in connection with FIGS. 3A and 3B, the reset state can correspond to a binary data value of "0," and have a higher resistance level than that of the set state. Similarly, the set state can correspond to a binary data value of "1," although embodiments are not so limited.

As shown in FIG. 4A, a memory system (e.g., memory system 104) comprising the memory 410 receives a host data pattern 426 from a host (e.g., host 102), and writes the host data pattern 426 in accordance with a number of embodiments of the present disclosure. Prior to being programmed to store the host data pattern 426, a managed unit 420 is in a free status (e.g., as shown at 420-1), in which all resistance variable memory cells 422-1, . . . , 422-8 are in a same state (e.g., reset state). In a number of embodiments, a managed unit may comprise a flag (e.g., 424-1, . . . , 424-4) that indicates whether a data pattern stored in the managed unit is inverted or not. Prior to being programmed to the host data pattern 426, the flag 424-1 may also be in a reset state (e.g., having a binary data value of "0"). The flag may be a particular bit in the managed unit, although embodiments are not so limited.

Responsive to receiving a write command associated with host data pattern 426, a controller (e.g., controller 108) is configured to perform pattern inversion prior to storing the data pattern to the managed unit responsive to determining that the host data pattern 426 includes at least a threshold quantity of data units (e.g., more than half) having a particular data value. For example, as shown in FIG. 4A, the host data pattern 426 comprises five data units 426-3, 426-4, 426-6, 426-7, and 426-8 having a binary data value of "1." When the threshold quantity is determined (e.g., predetermined) to be 50% such that the host data pattern 426 meets the threshold quantity (five data units out of eight data units have a binary data value of "1"), the pattern inversion is performed on the host data pattern 426. In this example, the pattern inversion performed on the host data pattern 426 (e.g., having a binary data pattern of "00110111") results in an inverted host data pattern (e.g., having a binary data pattern of "11001000).

Subsequent to performing the pattern inversion, the controller is configured to perform a write operation 453 to store the inverted host data pattern 426 to the managed unit 420, set a flag indicating that the managed unit 420 stores an inverted host data pattern, and update a status of the managed unit 420 from a free status to a valid status. As a result, the managed unit 420 at 420-2 (e.g., illustrating a status of the managed unit 420 subsequent to being programmed to the inverted host data pattern) includes resistance variable memory cells 424-1, . . . , 424-8 programmed to a binary data pattern "11001000," and a flag 424-2 set to a binary data value of "1" (e.g., indicating that the data pattern stored in the managed unit 420 at 420-2 is inverted).

Performing the pattern inversion provides benefits such as reducing energy consumption associated with flipping bits stored in memory cells having a binary value of "1." Consider the host data pattern 426 comprising five data units having a binary data value of "1." In this example, when the host data pattern 426 is written to the managed unit 420 without being inverted, a controller (e.g., controller 108) is required to flip five bits (e.g., stored in respective memory cells of the managed unit 420) during a cleaning operation. In contrast, the controller is merely required to flip three bits (e.g., stored in respective memory cells of the managed units 420) during the cleaning operation when the inverse of the host data pattern (e.g., including only three data units having a binary data value of "1") is written to the managed unit 420. As such, performing the pattern inversion reduces a quantity of cells of the managed unit programmed to the set state as compared to a quantity of cells of the managed unit that would be programmed to the set state in the absence of pattern inversion, which reduces latency associated with flipping bits (e.g., having a binary value of "1") stored in respective cells of the managed unit (e.g., managed unit 420).

At some point (e.g., 456), the controller is configured to invalidate (e.g., updating a status to an invalid status) the managed unit 420 such that the data pattern stored in the managed unit 420 at 420-2 is logically erased. As a result, the data pattern stored in the managed unit 420 at 420-3 (e.g., illustrating the managed unit 420 subsequent to being invalidated) is no longer tracked by, for example, a host (e.g., host 102), while physical remaining in the managed unit 420 at 420-3. The flag 424-3 is also invalidated responsive to the managed unit 420 being invalidated.

Responsive to determining that the managed unit 420 at 420-3 is in the invalid status, the controller 108 is configured to provide data state synchronization by performing a cleaning operation 457 that places, for example, only those resistance variable memory cells in a set state to a reset state. In this example, the cleaning operation 457 places the memory cells 422-1, 422-2, and 422-5 in a reset state such that all of the resistance variable memory cells 422-1, . . . , 422-8 are placed in a reset state. As a result, the managed unit 420 at 420-4 (e.g., illustrating a status of the managed unit 420 subsequent to performing the cleaning operation 457) includes a binary data pattern of "0000000." Similarly, the flag 424 is set to a reset state (e.g., as shown by a flag 424-4). As such, a subsequent write operation can be performed on the managed unit 420, in which all of the resistance variable memory cells that were previously set to a set state have a synchronized reset time (e.g., a time at which memory cells are placed in a reset state).

In a number of embodiments, the cleaning operation 457 can be performed in the background. For example, subsequent to invalidating a plurality of managed unit including the managed unit 420 (e.g., as shown by managed unit 420 at 420-3), the controller can be configured to perform the cleaning operation 457 on those managed units determined to have an invalid status during idle time (e.g., when the controller 108 is not executing host commands). Performing the cleaning operation as a background operation can provide benefits such as preventing such operations from negatively affecting latency, among others.

In a number of embodiments, the data state synchronization can be implemented via a controller (e.g., controller 108) that is located external to the memory 110. In this example, the controller is able to track respective statuses of a plurality of managed units of the memory 410, for example, via a logical to physical address table (e.g., logical to physical address table 109). As such, the controller (e.g., that can utilize information provided by the logical to physical address table) can be configured to maintain a pointer to a physical address corresponding to a particular one of a plurality of managed units (e.g., managed unit 420) designated for a subsequent write command and having a free status, and update the status of the particular managed unit to an invalid status subsequent to performing the write command (e.g., such that a subsequent write command is not performed on the same managed unit). Subsequently, the controller can be configured to further update the pointer to a next available managed unit (e.g., that is in a free status) such that each managed unit is prevented from being exceedingly overwritten, which can potentially reduce the reliability and/or useful life of the cell.

Figure 4B:
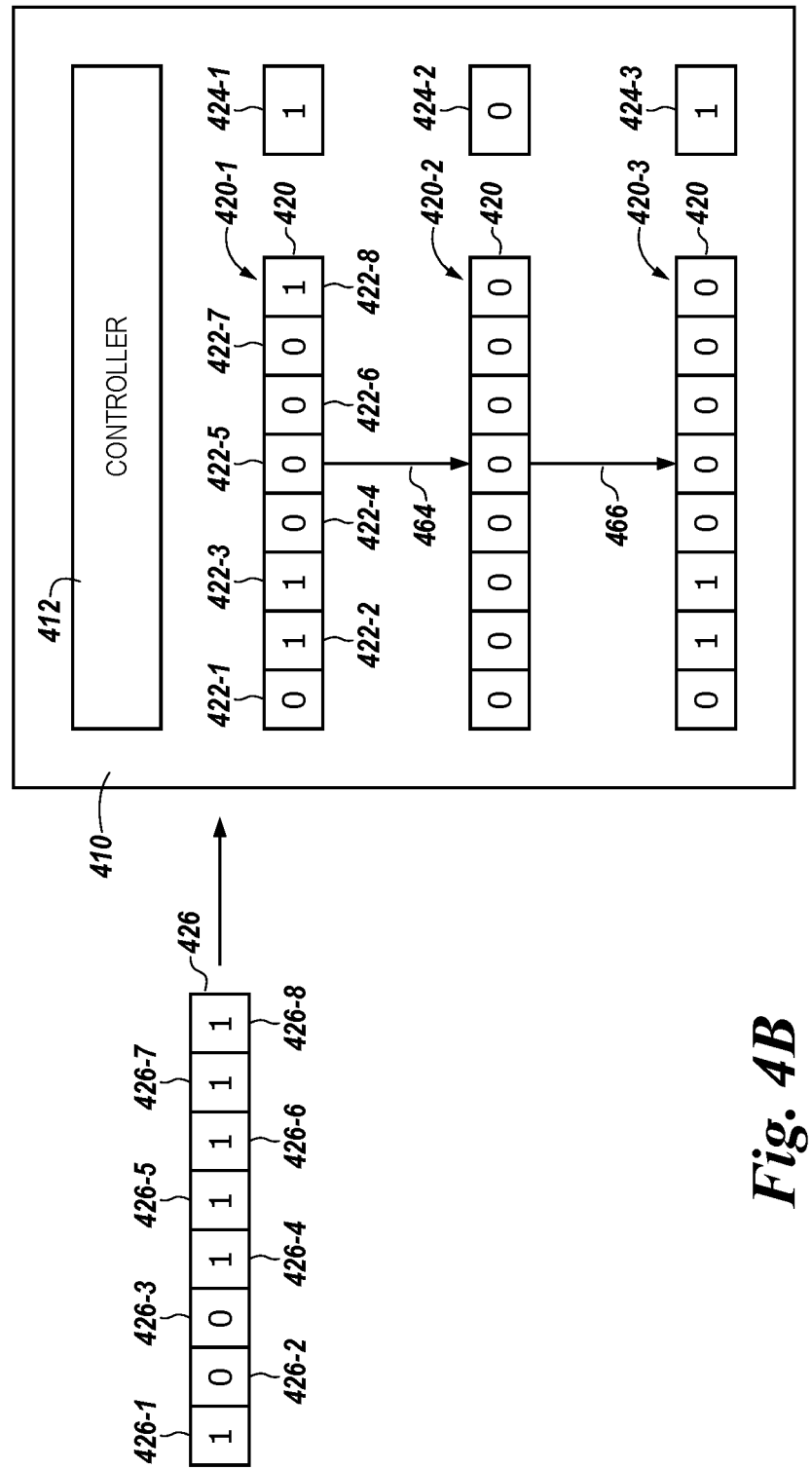
FIG. 4B illustrates another status of a managed unit associated with providing data state synchronization in accordance with a number of embodiments of the present disclosure

FIG. 4B illustrates another status of a managed unit 420 associated with providing data state synchronization in accordance with a number of embodiments of the present disclosure. In this example, the memory 410 comprises a plurality of managed units including a managed unit 420 corresponding to a group of resistance variable memory cells 422-1, . . . , 422-8 that are programmable to a reset state and a set state. As described above, the managed unit 420 may be a large managed unit (LMU) or a small managed unit (SMU). In some embodiments, a LMU may be a managed unit on the order of the 4K bytes, while a SMU may be on the order of 64 bytes. As illustrated in connection with FIG. 2, the reset state can correspond to a binary data value of "0," and have a higher resistance level than that of the set state. Similarly, the set state can correspond to a binary data value of "1," although embodiments are not so limited. Although only one managed unit is illustrated in FIG. 4B, the memory 410 can include a plurality of managed units corresponding to respective groups of resistance variable memory cells.

As shown in FIG. 4B, the memory 410 receives a command to write a host data pattern 426 having a binary data pattern of "10011111." Responsive to receiving the command, a controller 412 (e.g., memory controller 112) that is located internal to the memory 410 can be configured to perform a read operation (not shown in FIG. 4B) on the managed unit 420 to determine current states of resistance variable memory cells 422-1, . . . , 422-8 and a data polarity corresponding to the memory cells 422-1 . . . , 422-8. As a result of the read operation, the controller 412 determines that the resistance variable memory cells includes a binary data pattern of "01100001" (e.g., as shown in a managed unit 420 at 420-1), and the data pattern stored in the managed unit 420 is inverted (e.g., since an inversion flag 424 having a binary data value of "1" indicates that the data pattern stored in the managed unit 420 is an inverted data pattern). Embodiments are not so limited, however, and in some embodiments the above operations (e.g., a cleaning operation, etc.) may be performed on a binary data pattern in the absence of performing a read operation on the managed unit 420. For example, the above operations may be performed on data that stored in the memory cells 422-1, . . . , 422-8 (e.g., "old" data) without performing a read operation.

Subsequent to performing the read operation, the controller 412 is configured to perform a cleaning operation 464 on the managed unit 420 to place all of the resistance variable memory cells 422-1, . . . , 422-8 in a reset state. As such, the managed unit 420 at 420-2 (e.g., illustrating a status of the managed unit 420 subsequent to performing the cleaning operation 464) includes the cells each having a binary data value of "0." In a number of embodiments, performing the cleaning operation 464 can include applying a cleaning signal (e.g., reset signal) to only those memory cells (e.g., memory cells 422-2, 422-3, and 422-8) determined to be currently (e.g., at 420-1) programmed to a set state. Performing data state synchronization via the controller (e.g., controller 412) located internal to the memory 410 provides benefits such as reducing latency associated with tracking and/or updating statuses of respective managed units as compared to performing the same via the controller (e.g., controller 108) located external to the memory 410 and utilizing information provided from a logical to physical address table (e.g., table 107). As described above, embodiments are not so limited, and the controller 412 can be configured to perform the cleaning operation 464 on "old" data that is stored on the managed unit 420 without first performing a read operation. For example, the controller 412 may be configured to perform the cleaning operation 464 at any time it is determined that memory cells (e.g., memory cells 422-2, 422-3, and 422-8) are programmed to a set state.

Subsequent to performing the cleaning operation 464, the controller 412 can be configured to write (e.g., performing a write operation) one of the host data pattern 426 and an inverse of the host data pattern 426 to the managed unit 426 based on a characteristic of the host data pattern. As described in connection with FIG. 4A, the controller 412 can be configured to write the inverse of the host data pattern 426 responsive to determining that the host data pattern 426 includes at least a threshold quantity (e.g., 50%) of data units having, for example, a binary data value of "1." In this example, the host data pattern 426 includes six (e.g., out of ten) data units 426-1, 426-4, 426-5, 426-6, 426-7, and 426-8 having a binary data value of "1." As such, the controller 412 writes the inverse of the host data pattern (e.g., host data pattern 426) to the managed unit 420 such that the managed unit 420 at 420-3 (e.g., illustrating a status of the managed unit 420 subsequent to being programmed) includes a data pattern (e.g., a binary data pattern "01100000) corresponding to the inverse of the host data pattern (e.g., host data pattern 426).

Figure 5:
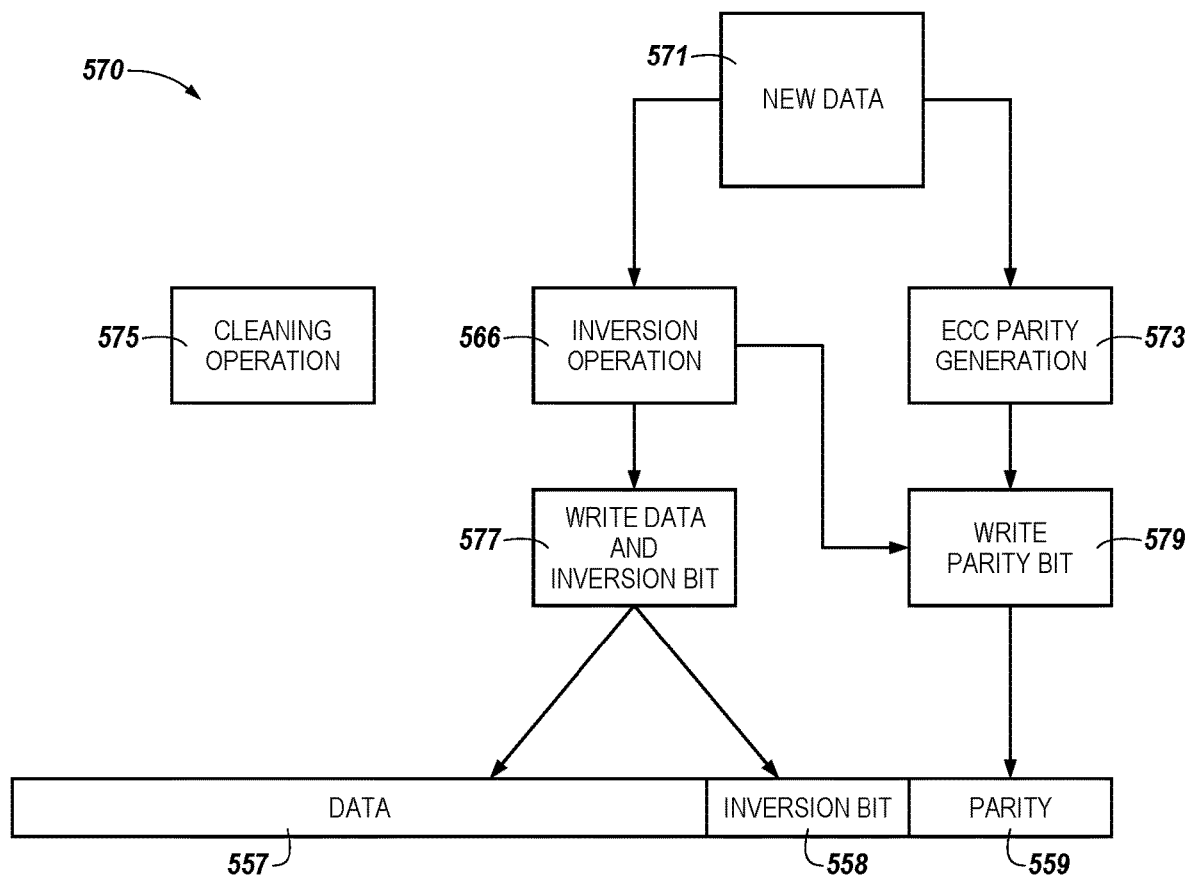
FIG. 5 illustrates a flow diagram associated with providing data state synchronization for write operations on a device page in accordance with a number of embodiments of the present disclosure.

FIG. 5 illustrates a flow diagram 570 associated with providing data state synchronization for write operations on a device page in accordance with a number of embodiments of the present disclosure. The data state synchronization for the write operation shown in flow diagram 570 may be performed in an embedded fashion, as described above. For example, the operations shown in flow diagram 570 may be performed using circuitry (e.g., controller 112, ECC circuitry 113, and/or inversion circuitry 115 illustrated in FIG. 1) that is deployed on the memory device. Accordingly, in some embodiments, data state synchronization for write operations may be performed without transferring commands to and/or from the memory device such that the host (e.g., host 102 illustrated in FIG. 1) is not encumbered during performance of the data state synchronization operation(s).

At block 571, new data (e.g., host data) may be received by the memory device. The new data may comprise user data and may, for example, be a page of data. As described above, the page of data may be a page of data on the order of 544 bits. For example, the page of data may include 512 data bits, 30 parity bits, one inversion bit, and one or more additional bits.

At block 566, an inversion operation may be performed on the new data to write the inverse of the new data pattern responsive to determining that the host data pattern includes at least a threshold quantity (e.g., 50%) of data units having, for example, a binary data value of "1," as described above in connection with FIGS. 4A and 4B. In some embodiments, the inversion operation may be performed by the inversion circuitry 115 illustrated in FIG. 1.

As block 573, ECC parity bits may be generated. Generation of the ECC parity bits may be performed by the ECC circuitry 113 shown in FIG. 1. The ECC parity bits may be utilized as part of an error correction operation performed on data, such as the new data received at block 571, by the memory device.

In some embodiments, a cleaning operation may also be performed, as shown at block 575. As shown in FIG. 5, the cleaning operation at block 575, the inversion operation 566, and/or generation of the ECC parity bits may be performed concurrently.

At block 577, a write operation to write data and/or an inversion bit may be performed as described in connection with FIGS. 4A and 4B, herein. For example, the data to be written to the memory device may include inverted data if the inversion operation performed at block 566 included writing the inverse of the new data. The data may be written to a data 557 portion of a physical block address, while the inversion bit may be written to an inversion bit portion 558 of the logical block address of the memory device.

At block 579, a write operation to write one or more parity bits may be performed. In some embodiments, the parity bits are ECC parity bits generated as part of the ECC parity generation shown at block 573. The ECC parity bits may include parity bits that have had an inversion operation performed thereon. For example, the ECC parity bits may be computed, for example, at block 573, and may have an inversion operation performed thereon as shown at block 566. Once the ECC parity bits are computed and/or inverted, they may be written to a parity 559 portion of the physical block address of the memory device.

Figure 6:
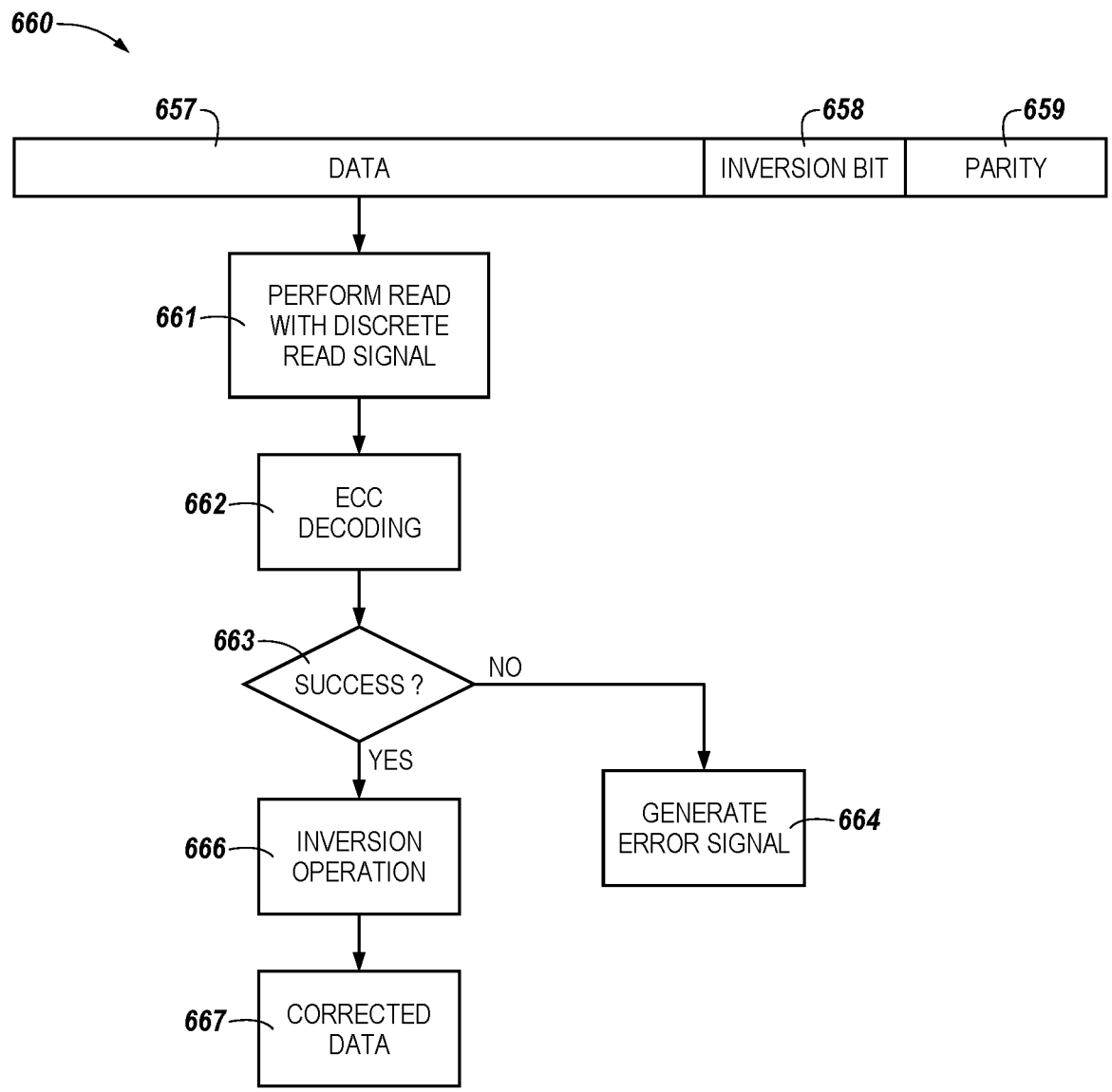
FIG. 6 illustrates a flow diagram associated with providing data state synchronization for read operations in accordance with a number of embodiments of the present disclosure.

FIG. 6 illustrates a flow diagram associated with providing data state synchronization for read operations in accordance with a number of embodiments of the present disclosure. The data state synchronization for the read operation shown in flow diagram 660 may be performed in an embedded fashion, as described above. For example, the operations shown in flow diagram 660 may be performed using circuitry (e.g., controller 112, ECC circuitry 113, and/or inversion circuitry 115 illustrated in FIG. 1) that is deployed on the memory device. Accordingly, in some embodiments, data state synchronization for write operations may be performed without transferring commands to and/or from the memory device such that the host (e.g., host 102 illustrated in FIG. 1) is not encumbered during performance of the data state synchronization operation(s).

As shown in FIG. 6, a logical block address may include data 657, an inversion bit(s) 658, and/or parity bit(s) 659. The data 657, inversion bit(s) 658, and/or the parity bit(s) 659 may be stored in a memory device. At block 661, the logical block may be read by the memory device. For example, the data 657, inversion bit(s) 658, and/or parity bit(s) 659 may be read using a discrete read signal (e.g., a read signal with a discrete voltage value associated therewith).

Subsequent to reading the data 657, inversion bit(s) 658, and/or parity bit(s) 659, at block 662, ECC decoding may be performed on the logical block. In some embodiments, the ECC decoding may be performed by ECC circuitry such as ECC circuitry 113 illustrated in FIG. 1. For example, the ECC decoding may be performed on the memory device without transferring the data to circuitry external to the memory device to perform the ECC decoding.

At block 663, a determination as to whether ECC decoding was successful may be made. For example, circuitry deployed on the memory device (e.g., the controller 112, the ECC circuitry 113, and/or the inversion circuitry 115) can be configured to determine if the decoding operation performed at block 662 was successful. If it is determined that the ECC decoding operation was not successful, at block 664, the memory device may be configured to generate an error signal and/or send the error signal to the memory system and/or a host device coupled to the memory system. In some embodiments, the error signal may be generated using the circuitry discussed above that is located on or within the memory device such that the error signal is generated on-die and/or without transferring commands to or from the memory device.

If it is determined that the ECC decoding operation performed at block 662 was successful, at block 666, an inversion operation may be performed on the data 657, the inversion bit(s) 658, and or the parity bit(s) 659. The inversion operation may be performed as described above in connection with FIGS. 4A and 4B, for example. In some embodiments, the inversion operation may be performed using circuitry that is located on or within the memory device such as the inversion circuitry 115 illustrated in FIG. 1, herein.

Following performance of the inversion operation at block 666, corrected data 667 may be generated, provided, and/or stored by the memory device. For example, the corrected data may be stored in the memory device in one or more pages of the memory device, such as a small managed unit, as described above.

Figure 7:
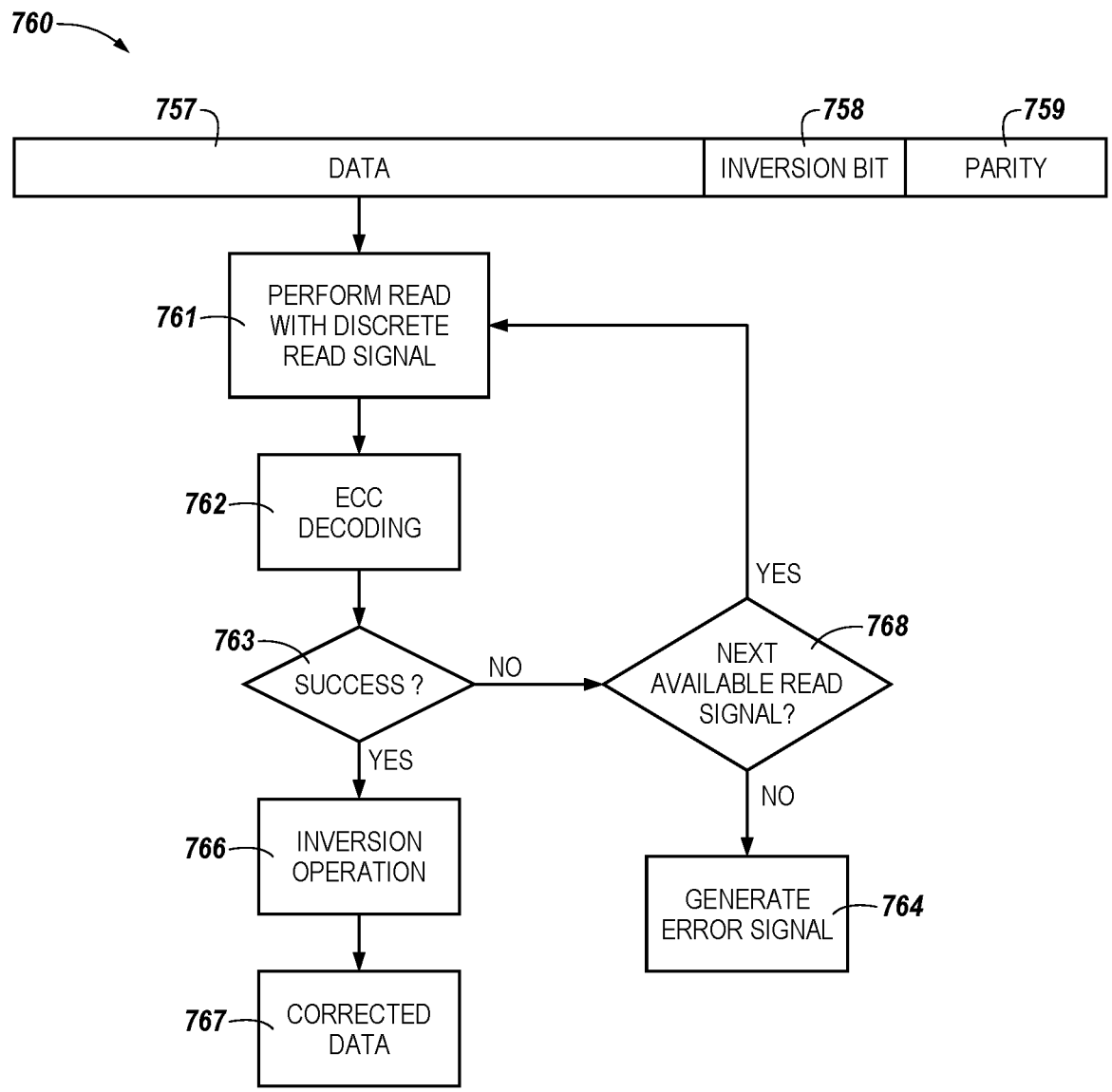
FIG. 7 illustrates another flow diagram associated with providing data state synchronization for read operations in accordance with a number of embodiments of the present disclosure.

FIG. 7 illustrates another flow diagram associated with providing data state synchronization for read operations in accordance with a number of embodiments of the present disclosure. The data state synchronization for the read operation shown in flow diagram 760 may be performed in an embedded fashion, as described above. For example, the operations shown in flow diagram 760 may be performed using circuitry (e.g., controller 112, ECC circuitry 113, and/or inversion circuitry 115 illustrated in FIG. 1) that is deployed on the memory device. Accordingly, in some embodiments, data state synchronization for write operations may be performed without transferring commands to and/or from the memory device such that the host (e.g., host 102 illustrated in FIG. 1) is not encumbered during performance of the data state synchronization operation(s).

As shown in FIG. 7, a logical block address may include data 757, an inversion bit(s) 758, and/or parity bit(s) 759. The data 757, inversion bit(s) 758, and/or the parity bit(s) 759 may be stored in a memory device. At block 761, the logical block may be read by the memory device. For example, the data 757, inversion bit(s) 758, and/or parity bit(s) 759 may be read using a discrete read signal (e.g., a read signal with a discrete voltage value associated therewith).

Subsequent to reading the data 757, inversion bit(s) 758, and/or parity bit(s) 759, at block 762, ECC decoding may be performed on the logical block. In some embodiments, the ECC decoding may be performed by ECC circuitry such as ECC circuitry 113 illustrated in FIG. 1. For example, the ECC decoding may be performed on the memory device without transferring the data to circuitry external to the memory device to perform the ECC decoding.

At block 763, a determination as to whether ECC decoding was successful may be made. For example, circuitry deployed on the memory device (e.g., the controller 112, the ECC circuitry 113, and/or the inversion circuitry 115) can be configured to determine if the decoding operation performed at block 762 was successful. If it is determined that the ECC decoding operation was not successful, at block 768, a determination as to whether a discrete read signal having a different voltage value associated therewith may be used to retry the read operation described at block 761. If there is another discrete read signal available (e.g., if it is determined that the read operation may be retried using a discrete read signal having a different voltage value associated therewith), the read operation may be retried at block 761. In some embodiments, the determination may be made using circuitry provided on or within the memory device, as described above.

If it is determined at block 768 that there is not another discrete read signal to try to perform the read operation with, at block at block 764, the memory device may be configured to generate an error signal and/or send the error signal to the memory system and/or a host device coupled to the memory system. In some embodiments, the error signal may be generated using the circuitry discussed above that is located on or within the memory device such that the error signal is generated on-die and/or without transferring commands to or from the memory device.

If it is determined that the ECC decoding operation performed at block 762 was successful, at block 766, an inversion operation may be performed on the data 757, the inversion bit(s) 758, and or the parity bit(s) 759. The inversion operation may be performed as described above in connection with FIGS. 4A and 4B, for example. In some embodiments, the inversion operation may be performed using circuitry that is located on or within the memory device such as the inversion circuitry 115 illustrated in FIG. 1, herein.

Following performance of the inversion operation at block 766, corrected data 767 may be generated, provided, and/or stored by the memory device. For example, the corrected data may be stored in the memory device in one or more pages of the memory device, such as a small managed unit, as described above.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
a memory comprising a plurality of managed units corresponding to respective groups of resistance variable memory cells; and
a controller coupled to the memory and configured to cause:

performance of a cleaning operation on a selected group of the memory cells to place the memory cells of the selected group of memory cells in a same state;
generation of error correction code (ECC) parity data; and
performance of a write operation on the selected group of cells to:
write an inverted state of at least one data value to the selected group of cells; and
write an inverted state of at least one of the ECC parity data to the selected group of cells; and
performance of an operation to update a status associated with at least one managed unit among the plurality of managed units from an invalid status state to a valid status state while refraining from updating the status associated with at least one managed unit among the plurality of managed units to a free status state in response to performance of the write operation.

2. The apparatus of claim 1, wherein the controller is further configured to cause the cleaning operation and generate the ECC parity bit to be performed concurrently.

3. The apparatus of claim 1, wherein the controller is further configured to cause the inverted state of the at least one data value and the inverted state of the at least one ECC parity data to be written to the selected group of cells concurrently.

4. The apparatus of claim 1, wherein the memory and the controller comprise an embedded data state sync system, and wherein the embedded data state sync system is deployed on a single chip.

5. The apparatus of claim 1, wherein the selected group of memory cells correspond to a small managed unit of memory cells.

6. The apparatus of claim 1, wherein the controller is further configured to cause performance of an inversion operation to invert at least one of the at least one data value and the at least one of the ECC parity data, wherein performance of the inversion operation reduces a quantity of the selected group of cells programmed to a higher resistance state.

7. The apparatus of claim 1, wherein the controller is further configured to cause:
a determination to be made as to whether the selected group of cells includes a threshold quantity of data units having a first particular data value associated therewith; and
in response to the determination, performance of an inversion operation on the data units having the first particular data value associated therewith to cause the data units having the first data value associated therewith to have a second particular data value associated therewith.

8. The apparatus of claim 1, wherein the controller is further configured to cause data units of the selected group of cells having a high resistance state associated therewith to be set to a low resistance state as part of performance of the cleaning operation.

9. The apparatus of claim 1, wherein the controller is further configured to cause data units of the selected group of cells having a low resistance state associated therewith to be set to a high resistance state as part of performance of the write operation.

10. An apparatus, comprising:
a memory comprising a plurality of managed units corresponding to respective groups of resistance variable memory cells; and
a controller coupled to the memory and configured to cause:
a determination to be made whether an inversion bit is stored in a selected group of memory cells;
performance of a read operation on the selected group of the memory cells;
error correction code (ECC) parity data stored in the selected group of memory cells to be decoded;
responsive to a determination that the ECC was successfully decoded, an inversion operation on data read in the selected group of cells to be performed in response to a determination that the inversion bit is stored in the selected group of memory cells; and
performance of an operation to update a status associated with at least one managed unit among the plurality of managed units from an invalid status state to a valid status state or from a valid status state to an invalid status state while refraining from updating the status associated with at least one managed unit among the plurality of managed units to a free status state in response to performance of the read operation.

11. The apparatus of claim 10, wherein the controller is further configured to, responsive to a determination that the ECC was successfully decoded, the inversion operation on data read in the selected group of cells to not be performed in response to a determination that inversion bit is not stored in the selected group of memory cells.

12. The apparatus of claim 10, wherein the controller is further configured to, responsive to a determination that the ECC was not successfully decoded, an error signal to be generated and transferred to a host device coupled to the memory.

13. The apparatus of claim 10, wherein the selected group of memory cells correspond to a small managed unit of memory cells.

14. The apparatus of claim 10, wherein the controller is further configured to cause the read operation to be performed using a read signal having a first voltage value associated therewith.

15. The apparatus of claim 14, wherein the controller is further configured to, responsive to a determination that the ECC was not successfully decoded, cause the read operation to be performed using a read signal having a second voltage associated therewith.

16. The apparatus of claim 10, further comprising inversion logic circuitry coupled to the memory and controller, wherein the controller is further configured to cause the inversion logic circuitry to perform the inversion operation.

17. The apparatus of claim 16, wherein the memory, the controller, and the inversion circuitry are deployed on a single die.

18. A method, comprising:
performing a cleaning operation on a group of resistance variable memory cells corresponding to a selected managed unit of memory cells to place the resistance variable corresponding to the selected managed unit of memory cells in a same state;
generating error correction code (ECC) parity data;
performing a write operation on the selected group of cells, the write operation comprising:
writing an inverted state of at least one data value to the selected group of cells; and
writing an inverted state of at least one of the ECC parity data to the selected group of cells; and
performing an operation to update a status associated with the selected managed unit from an invalid status state to a valid status state while refraining from updating the status associated with the selected managed unit to a free status state in response to performance of the write operation.

19. The method of claim 18, wherein generating the ECC parity data and performing the write operation further comprises carrying out the generating and performing operations using logic circuitry deployed on a single die that includes the plurality of memory cells.

20. The method of claim 18, further comprising setting data units of the selected group of cells having a high resistance state associated therewith to a low resistance state as part of performing the cleaning operation.

21. The method of claim 18, further comprising setting data units of the selected group of cells having a low resistance state associated therewith to a high resistance state as part of performance of the write operation.

22. The method of claim 18, further comprising performing the cleaning operation and generating the ECC parity bit concurrently.

23. The method of claim 18, further comprising writing the inverted state of the at least one data value and the inverted state of the at least one ECC parity data to the selected group of cells concurrently.

24. The method of claim 18, further comprising:
determining whether the selected group of cells includes a threshold quantity of data units having a first particular data value associated therewith; and
in response to the determination, performing an inversion operation on the data units having the first particular data value associated therewith to cause the data units having the first data value associated therewith to have a second particular data value associated therewith.

25. A method, comprising:
determining whether an inversion bit is stored in a group of resistance variable memory cells corresponding to a selected managed unit of memory cells;
performing a read operation on the selected group of the memory cells using a read signal having a first voltage value associated therewith;
decoding error correction code (ECC) parity data stored in the selected group of memory cells;
performing, responsive to a determination that the ECC was successfully decoded, an inversion operation on data read in the selected group of cells;
refraining from performing, responsive to a determination that the ECC was not successfully decoded, the inversion operation on data read in the selected group of cells; and
performing an operation to update a status associated with the selected managed unit from an invalid status state to a valid status state or from a valid status state to an invalid status state while refraining from updating the status associated with the selected managed unit to a free status state in response to performance of the read operation.

26. The method of claim 25, wherein performing the read operation, decoding the ECC parity data, and performing the inversion operation further comprises carrying out the performing and decoding operations using logic circuitry deployed on a single die that includes the plurality of memory cells.

27. The method of claim 25, further comprising:
performing the read operation using a read signal having a first voltage value associated therewith; and
responsive to a determination that the ECC was not successfully decoded, performing the read operation using a read signal having a second voltage associated therewith.

28. The method of claim 25, further comprising:
generating an error signal responsive to a determination that the ECC was not successfully decoded; and
transferring the error signal to a host device coupled to the memory cells.

* * * * *